(12) United States Patent
Schulze et al.

(10) Patent No.: US 11,742,384 B2
(45) Date of Patent: Aug. 29, 2023

(54) VERTICAL POWER SEMICONDUCTOR DEVICE INCLUDING A FIELD STOP REGION HAVING A PLURALITY OF IMPURITY PEAKS

(71) Applicant: Infineon Technologies AG, Neubiberg (DE)

(72) Inventors: Hans-Joachim Schulze, Taufkirchen (DE); Christian Jaeger, Munich (DE); Moriz Jelinek, Villach (AT); Daniel Schloegl, Villach (AT); Benedikt Stoib, Feldkirchen-Westerham (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/217,251

(22) Filed: Mar. 30, 2021

(65) Prior Publication Data

US 2021/0320174 A1 Oct. 14, 2021

(30) Foreign Application Priority Data

Apr. 9, 2020 (DE) .......................... 102020110072.8

(51) Int. Cl.
*H01L 29/08* (2006.01)
*H01L 29/739* (2006.01)
(Continued)

(52) U.S. Cl.
CPC .... *H01L 29/0834* (2013.01); *H01L 21/26513* (2013.01); *H01L 21/3221* (2013.01);
(Continued)

(58) Field of Classification Search
CPC .......... H01L 29/0834; H01L 21/26513; H01L 21/3221; H01L 29/0638; H01L 29/1095;
(Continued)

(56) References Cited

U.S. PATENT DOCUMENTS

| 11,335,772 B2 * | 5/2022 | Tamura ................. H01L 29/739 |
| 2018/0012762 A1 * | 1/2018 | Mukai ................. H01L 29/0638 |

(Continued)

OTHER PUBLICATIONS

Peter, Pichler, "Properties of Vacancies in Silicon Determined from Laser-Annealing Experiments", European Solid-State Device Research Conference, 2002, pp. 335-338.

*Primary Examiner* — Mohammad M Hoque
(74) *Attorney, Agent, or Firm* — Murphy, Bilak & Homiller, PLLC

(57) ABSTRACT

A vertical power semiconductor device is proposed. The vertical power semiconductor device includes a semiconductor body having a first main surface and a second main surface opposite to the first main surface along a vertical direction. The vertical power semiconductor device further includes a drift region in the semiconductor body. The drift region includes platinum atoms. The vertical power semiconductor device further includes a field stop region in the semiconductor body between the drift region and the second main surface. The field stop region includes a plurality of impurity peaks. A first impurity peak of the plurality of impurity peaks has a larger concentration than a second impurity peak of the plurality of impurity peaks. The first impurity peak includes hydrogen and the second impurity peak includes helium.

14 Claims, 4 Drawing Sheets

(51) Int. Cl.
   *H01L 29/06*     (2006.01)
   *H01L 29/66*     (2006.01)
   *H01L 21/265*    (2006.01)
   *H01L 21/322*    (2006.01)
   *H01L 29/10*     (2006.01)

(52) U.S. Cl.
   CPC ...... *H01L 29/0638* (2013.01); *H01L 29/1095* (2013.01); *H01L 29/66333* (2013.01); *H01L 29/7395* (2013.01)

(58) Field of Classification Search
   CPC ........... H01L 29/66333; H01L 29/7395; H01L 29/167; H01L 21/26506; H01L 21/26586; H01L 21/221; H01L 29/0873; H01L 29/36; H01L 29/7811; H01L 29/861; H01L 29/0603; H01L 21/265; H01L 29/0684; H01L 29/6609; H01L 29/8613
   USPC ....................................................... 257/143
   See application file for complete search history.

(56) References Cited

U.S. PATENT DOCUMENTS

| | | | |
|---|---|---|---|
| 2018/0350962 A1* | 12/2018 | Naito | H01L 29/66348 |
| 2019/0189463 A1 | 6/2019 | Schmidt et al. | |
| 2020/0098911 A1 | 3/2020 | Felsl et al. | |
| 2020/0194562 A1* | 6/2020 | Yoshimura | H01L 21/265 |
| 2021/0050215 A1* | 2/2021 | Agata | H01L 21/221 |

* cited by examiner

VERTICAL POWER SEMICONDUCTOR DEVICE INCLUDING A FIELD STOP REGION HAVING A PLURALITY OF IMPURITY PEAKS

TECHNICAL FIELD

The present disclosure is related to semiconductor devices, in particular to vertical power semiconductor devices including a field stop region.

BACKGROUND

In semiconductor switching devices like IGBTs (insulated gate bipolar transistors) or diodes mobile charge carriers flood a low-doped drift region and form a charge carrier plasma that provides a low on-state resistance. One target of semiconductor device technology lies in the reduction of electric power dissipation in semiconductor switching devices. Although electric power dissipation may be improved by varying a certain device parameter, this may lead to deterioration of another device characteristic. Thus, device parameters are designed during technology development based on a number of tradeoffs to be met in view of target device specifications.

There is a need to reduce electric power dissipation in vertical power semiconductor devices.

SUMMARY

An example of the present disclosure relates to a vertical power semiconductor device. The vertical power semiconductor device includes a semiconductor body having a first main surface and a second main surface opposite to the first main surface along a vertical direction. The vertical power semiconductor device further includes a drift region in the semiconductor body. The drift region includes platinum atoms (Pt). A field stop region is arranged in the semiconductor body between the drift region and the second main surface. The field stop region includes a plurality of impurity peaks. A first impurity peak of the plurality of impurity peaks has a larger concentration than a second impurity peak of the plurality of impurity peaks. The first impurity peak includes hydrogen (H) or is a hydrogen peak and the second impurity peak includes helium (He) or is a helium peak.

Another example of the present disclosure relates to a method of manufacturing a vertical power semiconductor device. The method includes forming a drift region in a semiconductor body having a first main surface and a second main surface opposite to the first main surface along a vertical direction, wherein the drift region includes platinum atoms. The method further includes forming a field stop region in the semiconductor body between the drift region and the second main surface, wherein the field stop region includes a plurality of impurity peaks, and a first impurity peak of the plurality of impurity peaks is set a larger concentration than a second impurity peak of the plurality of impurity peaks. The first impurity peak includes hydrogen or is a hydrogen peak and the second impurity peak includes helium or is a helium peak.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a vertical power semiconductor device and a method of manufacturing a vertical power semiconductor device and together with the description serve to explain principles of the embodiments. Further embodiments are described in the following detailed description and the claims.

DETAILED DESCRIPTION

Figure 1:
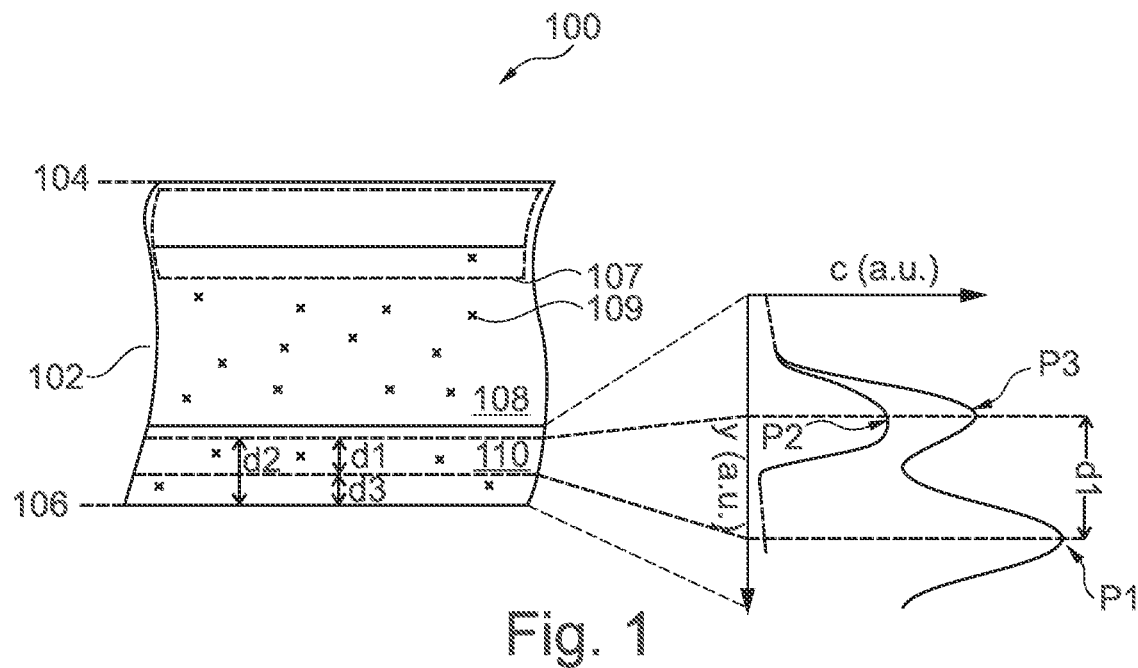
FIGS. 1 to 3 are schematic cross-sectional views for illustrating examples of vertical power semiconductor devices including platinum in a drift region and hydrogen gettering provisions in a field stop region.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state. An ohmic contact is a non-rectifying electrical junction with a linear or almost linear current-voltage characteristic.

Ranges given for physical dimensions include the boundary values. For example, a range for a parameter y from a to b reads as $a \leq y \leq b$. A parameter y with a value of at least c reads as $c \leq y$ and a parameter y with a value of at most d reads as $y \leq d$.

The term "on" is not to be construed as meaning only "directly on". Rather, if one element is positioned "on"

another element (e.g., a layer is "on" another layer or "on" a substrate), a further component (e.g., a further layer) may be positioned between the two elements (e.g., a further layer may be positioned between a layer and a substrate if the layer is "on" said substrate).

An example of a vertical power semiconductor device may include a semiconductor body having a first main surface and a second main surface opposite to the first main surface along a vertical direction. The vertical power semiconductor device may further include a drift region in the semiconductor body. The drift region may include platinum atoms. The vertical power semiconductor device may further include a field stop region in the semiconductor body between the drift region and the second main surface. The field stop region may include a plurality of impurity peaks. A first impurity peak of the plurality of impurity peaks has a larger concentration than a second impurity peak of the plurality of impurity peaks. The first impurity peak may include hydrogen or may be a hydrogen peak and the second impurity peak may include helium or may be a helium peak.

The vertical power semiconductor device may be a power semiconductor diode, or a power semiconductor IGBT (insulated gate bipolar transistor), or a reverse conducting (RC) IGBT or a power semiconductor transistor such as a power semiconductor IGFET (insulated gate field effect transistor, e.g. a metal oxide semiconductor field effect transistor). The vertical power semiconductor device may be configured to conduct currents of more than 1A or more than 10 A or even more than 30 A and may be further configured to block voltages between load terminals, e.g. between emitter and collector of an IGBT, or between cathode and anode of a diode, or between drain and source of a MOSFET in the range of several hundreds of up to several thousands of volts, e.g. 400 V, 650V, 1.2 kV, 1.7 kV, 3.3 kV, 4.5 kV, 5.5 kV, 6 kV, 6.5 kV. The blocking voltage may correspond to a voltage class specified in a datasheet of the power semiconductor device, for example.

The semiconductor body may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe). For example, the semiconductor body may be a magnetic Czochralski, MCZ, or a float zone (FZ) or an epitaxially deposited silicon semiconductor body.

For example, an impurity concentration in the drift region may gradually or in steps increase or decrease with increasing distance to the first main surface at least in portions of its vertical extension. According to other examples the impurity concentration in the drift region may be approximately uniform. For IGBTs based on silicon, a mean impurity concentration in the drift region may be between $5 \times 10^{12}$ $cm^{-3}$ and $1 \times 10^{15}$ $cm^{-3}$, for example in a range from $1 \times 10^{13}$ $cm^{-3}$ to $2 \times 10^{14}$ $cm^{-3}$. In the case of a semiconductor device based on SiC, a mean impurity concentration in the drift region may be between $5 \times 10^{14}$ $cm^{-3}$ and $1 \times 10^{17}$ $cm^{-3}$, for example in a range from $1 \times 10^{15}$ $cm^{-3}$ to $2 \times 10^{16}$ $cm^{-3}$. A vertical extension of the drift region may depend on voltage blocking requirements, e.g. a specified voltage class, of the vertical power semiconductor device. When operating the vertical power semiconductor device in voltage blocking mode, a space charge region may vertically extend partly or totally through the drift region depending on the blocking voltage applied to the vertical power semiconductor device. When operating the vertical power semiconductor device at or close to the specified maximum blocking voltage, the space charge region may reach or penetrate into the field stop region. The field stop region is configured to prevent the space charge region from further reaching to the cathode or collector at the second main surface of the semiconductor body. In this manner, the drift or base region may be formed using desired low doping levels and with a desired thickness while achieving soft switching for the semiconductor device thus formed.

Since the field stop region aims at preventing the space charge region from reaching the cathode or collector at the second main surface of the semiconductor body in a voltage blocking mode at or around maximum specified voltage blocking capabilities of the semiconductor device, a mean net impurity concentration in the field stop layer may be higher than in the drift region by at least one order of magnitude, for example. Moreover, the mean net impurity concentration in the field stop layer may be lower than the impurity concentration in a cathode contact layer ore collector contact layer by at least one order of magnitude, for example.

For example, a total impurity concentration at a vertical position of the first impurity peak may predominantly include hydrogen, e.g. more than 60% of hydrogen, or more than 70% of hydrogen, or more than 80% of hydrogen, or even more than 90% of hydrogen. For example, a vertical impurity concentration profile of the hydrogen may have a peak at a vertical position of the first impurity peak, for example.

For example, a vertical impurity concentration profile of the helium may have a peak at a vertical position of the second peak, for example.

By combining the platinum in the drift region and the helium in the second impurity peak, a leakage current may be reduced by avoiding or at least by reducing the undesired formation of platinum hydrogen complexes in the drift region. This may be achieved by gettering of hydrogen via the second impurity peak including the helium. Thereby, undesired diffusion of hydrogen from the first impurity peak into the drift region may be reduced or suppressed.

For example, a first vertical distance between the first impurity peak and the second impurity peak may range from 0 μm and ±5 μm, or from 2 μm to 5 μm, or from −2 μm to −5 μm. For example, the first impurity peak may be arranged between the second impurity peak and the second main surface. According to another example, the first impurity peak may be arranged between the second impurity peak and the first main surface. The first and second impurity peaks may also coincide.

For example, a third impurity peak of the plurality of impurity peaks may be disposed at a vertical distance from the second main surface that differs from 0 to 300 nm and/or less than a half-width (HW) of the second impurity peak P2 from the second vertical distance of the second impurity peak. The third impurity peak may include hydrogen or may be a hydrogen peak. For example, a concentration of the third impurity peak may be larger than a concentration of the second impurity peak.

For example, the second vertical distance may be larger than a third vertical distance between the second main surface and the first impurity peak. Thus, a helium peak may be disposed between the drift region and a hydrogen peak of the field stop region, for example a hydrogen peak having a largest hydrogen peak concentration in the field stop region. This may allow for a beneficial gettering of hydrogen diffusing from the hydrogen peak toward the drift region, for example. Thereby, a leakage current may be reduced by avoiding or at least reducing the undesired formation of platinum-hydrogen complexes in the drift region.

For example, the second vertical distance may be smaller than a third vertical distance between the second main surface and the first impurity peak. Decoration of vacancies caused by implantation of He may lead to a beneficial decrease of the lateral resistance in a surface area of the second main surface, for example.

For example, a fourth impurity peak of the plurality of impurity peaks may include helium and may be disposed at a fourth vertical distance from the second main surface. The third vertical distance may range between the second vertical distance and the fourth vertical distance. For example, a vertical impurity concentration profile of the helium may not only have a peak at a vertical position of the second impurity peak, but may have another peak at a vertical position of the fourth impurity peak. Along the vertical direction, a deepest hydrogen peak of the field stop region, i.e. a hydrogen peak of the field stop region having a largest vertical distance to the second main surface, e.g. the first impurity peak, may be arranged between opposite helium peaks, e.g. the second impurity peak and the fourth impurity peak, for example. Thereby, gettering of hydrogen diffusing from the hydrogen peak toward the drift region may be further improved, for example. Furthermore, reducing the diffusion constant of hydrogen in the helium-containing peak region located below the hydrogen-containing main peak may also contribute to a reduced diffusion of hydrogen into the drift zone. A leakage current may thus be reduced by avoiding or at least reducing the undesired formation of platinum-hydrogen complexes in the drift region. For example, a helium dose associated with the second impurity peak may also be spread across a plurality of second helium sub-peaks, e.g. by carrying out a plurality of helium ion implantations at different ion implantation energies and/or different ion implantation angles, wherein the second helium sub-peaks may be arranged either between the first impurity peak, e.g. a hydrogen peak in the drift region, and the first main surface or between the first impurity peak and the second main surface. Likewise, a helium dose associated with the fourth impurity peak may also be spread across a plurality of second helium sub-peaks, e.g. by carrying out a plurality of helium ion implantations at different ion implantation energies and/or different ion implantation angles, wherein the fourth helium sub-peaks may be arranged either between the first impurity peak, e.g. a hydrogen peak in the drift region, and the second main surface or between the first impurity peak and the first main surface. This may lead to approximately box-shaped helium concentration profiles along the vertical direction. By spreading the helium across a larger vertical distance by multiple helium sub-peaks compared to a single helium peak implantation, a certain helium dose or hydrogen gettering may be achieved at comparatively lower ion implantation damage compared to a single ion implantation, for example.

For example, a ratio between a peak concentration of the first impurity peak, e.g. a hydrogen peak concentration, and a peak concentration of the second impurity peak, e.g. a helium peak concentration, may range from 10 to 1000, or may range from 50 to 500. Since helium ion implantation doses are significantly smaller compared to proton implantation doses with respect to generation of a certain concentration of vacancies, the required total implantation dose for the different peaks for achieving a certain total integrated (into vertical direction along the field stop profile) field stop doping dose can be significantly reduced and therefore process time and process costs can be reduced.

For example, a helium peak concentration of the second impurity peak, e.g. a helium concentration, may range from $1 \times 10^{16}$ cm$^{-3}$ to $2 \times 10^{18}$ cm$^{-3}$, or from $2 \times 10^{16}$ cm$^{-3}$ to $1 \times 10^{18}$ cm$^{-3}$, or from $5 \times 10^{16}$ cm$^{-3}$ to $5 \times 10^{17}$ cm$^{-3}$.

For example, a maximum concentration of platinum in the drift region may range from $5 \times 10^{12}$ cm$^{-3}$ to $3 \times 10^{14}$ cm$^{-3}$. For example, a concentration of platinum may decrease from the second main surface toward and at least partly through the drift region. For example, a concentration of platinum may exhibit a minimum within the drift zone. For example, platinum may be introduced into the drift region by one or more ion implantation processes into the front side or the backside of the wafer and/or diffusion process(es) out of a diffusion source, e.g. a platinum silicide on a surface of the semiconductor body.

For example, the drift region may have a vertical extension from the field stop region to a pn-junction, e.g. a pn-junction between a drift region and a body region of an IGBT or a pn-junction between the drift region and an anode region of a diode. The pn-junction may be located closer, e.g. at a smaller vertical distance, to the first main surface than to the second main surface. A maximum concentration of hydrogen in the drift region may be smaller than 100%, or 50% or 20% of a concentration of platinum along at least 50% of the vertical extension of the drift region. The vertical extension of the drift region may be confined by the pn-junction at a first end of the drift region oriented to the first main surface, and a second end of the drift region oriented to the second main surface, wherein the second end of the drift region may be at a transition between the drift region and the field stop region. The hydrogen concentration in the drift region may be reduced due to hydrogen gettering in the field stop region by the introduction of helium into the drift region, for example.

For example, the platinum atoms in the drift region may be configured as platinum-hydrogen complexes and substitutional platinum. A maximum concentration of the platinum-hydrogen complexes in the drift region may be smaller than a concentration of the substitutional platinum along at least 50% of the vertical extension of the drift region. For example, the maximum concentration of the platinum-hydrogen complexes in the drift region may be at most 60% or even 40% or even 20% of the concentration of the substitutional platinum along at least 50% of the vertical extension of the drift region. By keeping a concentration of the platinum-hydrogen complexes along a predominant part of the drift region smaller than the concentration of the substitutional platinum, a leakage current, and thus electric power dissipation, of the semiconductor device may be reduced.

Details described above with respect to the vertical semiconductor power device, e.g. materials, dimensions, technical effects, likewise apply to the examples of manufacturing methods described below.

An example of a method of manufacturing a vertical power semiconductor device may include forming a drift region in a semiconductor body having a first main surface and a second main surface opposite to the first main surface along a vertical direction, wherein the drift region may include platinum. The method may further include forming a field stop region in the semiconductor body between the drift region and the second main surface. The field stop region may include a plurality of impurity peaks, and a first impurity peak of the plurality of impurity peaks is set a larger concentration than a second impurity peak of the plurality of impurity peaks. The first impurity peak may include hydrogen or may be a hydrogen peak and the second impurity peak may include helium or may be a helium peak.

For example, forming the first impurity peak may include at least one proton implantation process having a proton implantation dose ranging from $2\times10^{13}$ cm$^{-2}$ to $5\times10^{14}$ cm$^{-2}$. For example, a plurality of proton implantation processes may be carried out, wherein a proton implantation dose may decrease with increasing proton implantation energy. Thus, hydrogen peak concentrations in the field stop region may decrease with an increase in a vertical distance from the second main surface, for example.

For example, forming the second impurity peak may include at least one helium ion implantation process. The semiconductor body may be annealed in a temperature range from 350° C. to 430° C. for 0.5 to 5 hours after the at least one proton implantation process and after the at least one helium ion implantation process.

For example, a first vertical distance between the first impurity peak and the second impurity peak may be set in a range from 0 μm to ±5 μm.

For example, the method may further comprise forming a fourth impurity peak in the field stop region by at least one helium ion implantation process. The fourth impurity peak may be set at a fourth vertical distance from the second main surface. The first impurity peak may be arranged between the second impurity peak and the fourth impurity peak along the vertical direction.

For example, the method may further comprise implanting helium ions into the semiconductor body by a plurality of different ion implantation tilt angles. This may allow for setting a box-shaped vertical concentration profile of helium which may be a concentration profile having a larger vertical extension, a smaller damage concentration and a lower peak concentration than a single helium peak profile when assuming equal helium implantation doses for both cases. Different ion implantation angles may be combined with different helium ion implantation energies to achieve desired vertical concentration profiles of helium for improving hydrogen gettering, for example.

For example, the platinum is introduced into the drift region at a maximum concentration ranging from $5\times10^{12}$ cm$^{-3}$ to $3\times10^{14}$ cm$^{-3}$. For example, the platinum may be introduced by a diffusion process above 750° C. or above 800° C. into the drift region. The platinum may be introduced prior to the implantation of hydrogen, for example.

For example, the drift region has a vertical extension from the field stop region to a pn-junction. A maximum concentration of hydrogen in the drift region may be set smaller than a concentration of platinum along at least 50% of the vertical extension of the drift region.

For example, the platinum in the drift region may include platinum-hydrogen complexes and substitutional platinum. A maximum concentration of the platinum-hydrogen complexes in the drift region may be set smaller than a concentration of the substitutional platinum along at least 50% of the vertical extension of the drift region.

For example, a maximum hydrogen concentration in the field stop region may be at least a factor of 5 larger, or a factor of 20 larger, or a factor 100 larger, or a factor of 500 larger than a maximum hydrogen concentration in the drift region.

The examples and features described above and below may be combined.

In the following, further examples of vertical power semiconductor devices and manufacturing methods are explained in connection with the accompanying drawings. Functional and structural details described with respect to the examples above shall likewise apply to the exemplary embodiments illustrated in the figures and described further below.

FIG. 1 is a schematic cross-sectional view illustrating an embodiment of a vertical power semiconductor device 100. The vertical power semiconductor device 100 includes a semiconductor body 102 having a first main surface 104 and a second main surface 106 opposite to the first main surface 104. A thickness of the semiconductor body 102 between the first main surface 104 and the second main surface 106 ranges from several tens of micrometers to several hundreds of micrometers depending, inter alia, on a specified voltage class of the vertical power semiconductor device, for example.

Active device elements may be formed in an active device area of the semiconductor body 102 at the first main surface 104. A portion where the active device elements are located is schematically indicated in the figures by a dashed box 107. The active device area is an area of the semiconductor body 102 where a load current flow enters/exits the semiconductor body through the first main surface 104. In case of IGFETs or IGBTs, the active device area may include source regions electrically connected to a contact electrode through the first main surface 104. A source to drain current or emitter to collector current may flow from the contact electrode through the first main surface 104 into the source regions. In case of diodes, the active device area may include anode or cathode regions electrically connected to the contact electrode through the first main surface 104. An anode to cathode current may flow from the contact electrode through the first main surface 104 into the anode or cathode regions. Thus, the active device area may be restricted to a first part of the first main surface through which load current flow is guided, for example.

The edge termination elements may be formed in an edge termination area, which is an area of the semiconductor body 102 that partly or fully surrounds the active device area. Since pn junctions within the semiconductor body 102, e.g. pn junctions between a body region and a drift region of an IGFET or an IGBT or pn junctions between a cathode and an anode region of a diode, are not infinite, but terminate at the edge zones of the semiconductor body, this edge effect limits the device breakdown voltage below the ideal value that is set by the infinite parallel plane junction. Care must be taken to ensure proper and efficient termination of the pn junction at the edge of the semiconductor body. The edge termination area is a measure for ensuring proper and efficient termination of the pn junction. In the edge termination area, the edge termination structures are formed for lowering the electric field at the edge of the semiconductor body. Depending on the voltage class of the semiconductor device, a lateral dimension of the edge termination area may vary. Semiconductor devices with higher voltage classes typically require larger lateral extensions of their edge termination areas for ensuring proper termination of the pn junction. Examples of edge termination structures in the edge termination area include field plates, junction termination extension (JTE) structures, variation of lateral doping (VLD) structures, for example.

The vertical power semiconductor device 100 further includes a drift region 108 in the semiconductor body 102. The drift region 108 includes platinum. The platinum in the drift region 108 is schematically illustrated in the figures by crosses 109. A field stop region 110 is arranged in the semiconductor body 102 between the drift region 108 and the second main surface 106. The field stop region 110 includes a plurality of impurity peaks. In the example illustrated in FIG. 1, three impurity peaks are illustrated. A first impurity peak P1 of the plurality of impurity peaks has a larger concentration c than a second impurity peak P2 of the plurality of impurity peaks. The first impurity peak P1 is a hydrogen peak and the second impurity peak P2 is a helium peak. A first vertical distance d1 between the first impurity peak P1 and the second impurity peak P2 ranges from 0 µm to ±5 µm. In the illustrated example, the first vertical distance d1 is negative. Hence, the second impurity peak P2 is arranged between the first impurity peak P1 and the first main surface 104. A second vertical distance d2 from the second main surface 106 to the second impurity peak P2 is thus larger than a third vertical distance d3 from the second main surface 106 to the first impurity peak P1.

The vertical power semiconductor device 100 further includes a third impurity peak P3, e.g. a hydrogen peak that is disposed close to or congruent with the second impurity peak P2. For example, the third impurity peak P3 may be disposed at a vertical distance from the second main surface 106 that differs from 0 to ±300 nm with respect to the second vertical distance d2 of the second impurity peak P2. The third impurity peak P3 is a hydrogen peak.

Figure 2:
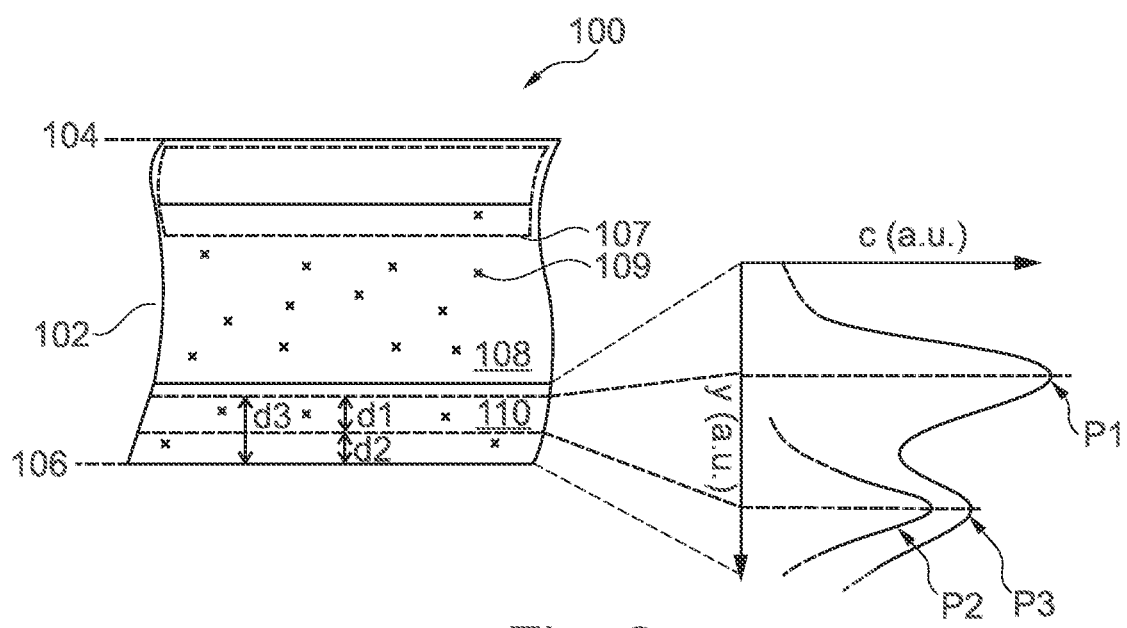

FIG. 2 is a schematic cross-sectional view for illustrating another embodiment of a vertical power semiconductor device 100. In the illustrated example, the first distance d1 is positive. Hence, the second impurity peak P2 is arranged between the first impurity peak P1 and the second main surface 106. The second vertical distance d2 from the second main surface 106 to the second impurity peak P2 is thus smaller than the third vertical distance d3 from the second main surface 106 to the first impurity peak P1.

Figure 3:
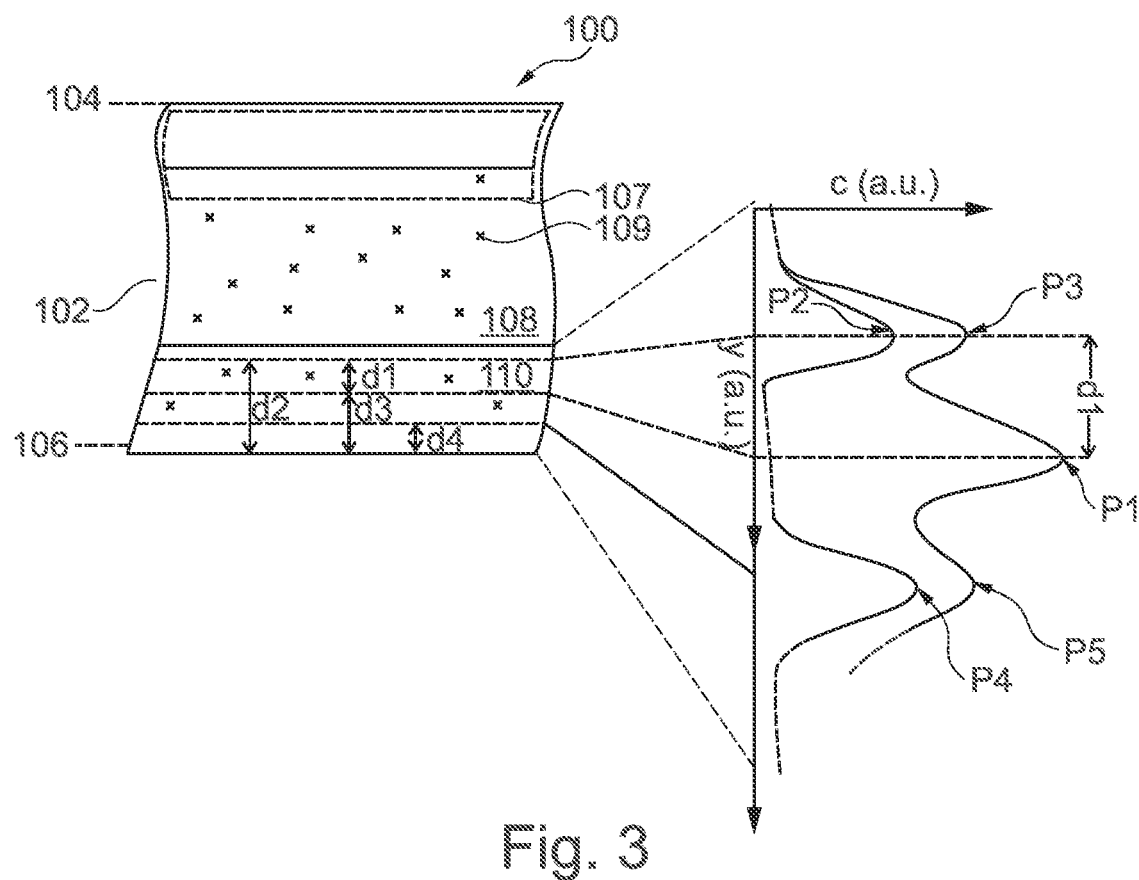

FIG. 3 is a schematic cross-sectional view illustrating another embodiment of a vertical power semiconductor device 100. In the illustrated example, the vertical power semiconductor device 100 further includes a fourth impurity peak P4 that is disposed at a fourth vertical distance d4 from the second main surface 106. The fourth impurity peak P4 is a helium peak. The third vertical distance d3 ranges between the second vertical distance d2 and the fourth vertical distance d4. Thus, the first impurity peak P1 is arranged between the second and fourth impurity peaks P2, P4. The vertical power semiconductor device 100 further includes a fifth impurity peak P5, e.g. a hydrogen peak that is disposed close to or congruent with the fourth impurity peak P4. For example, the fifth impurity peak P5 may be disposed at a vertical distance from the second main surface 106 that differs from 0 to ±300 nm with respect to the fourth vertical distance d4 of the fourth impurity peak P4. The fifth impurity peak P5 is a hydrogen peak.

Figure 4:
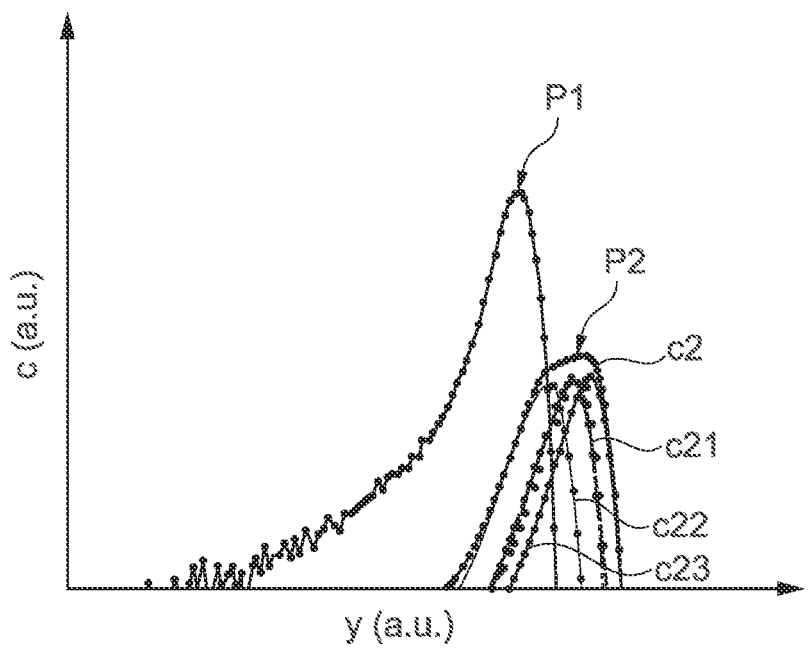
FIGS. 4 to 6 are schematic graphs illustrating exemplary impurity concentrations c versus a vertical direction y in the field stop region of vertical power semiconductor devices.
Figure 5:
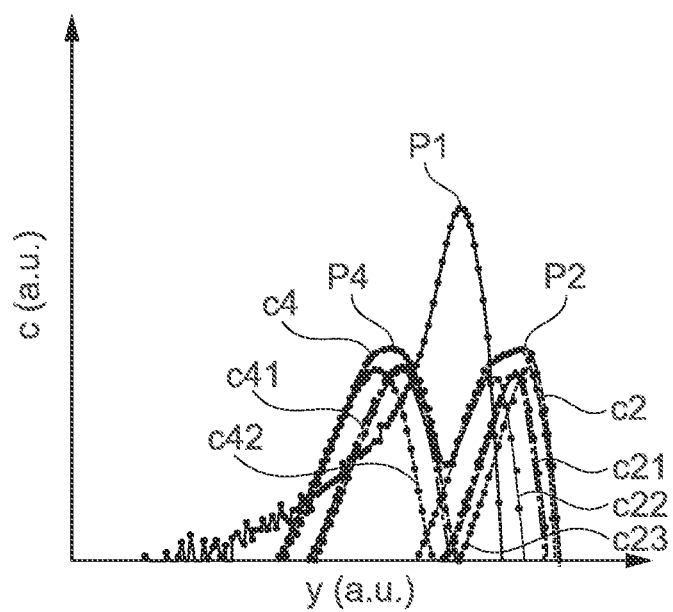
Figure 6:
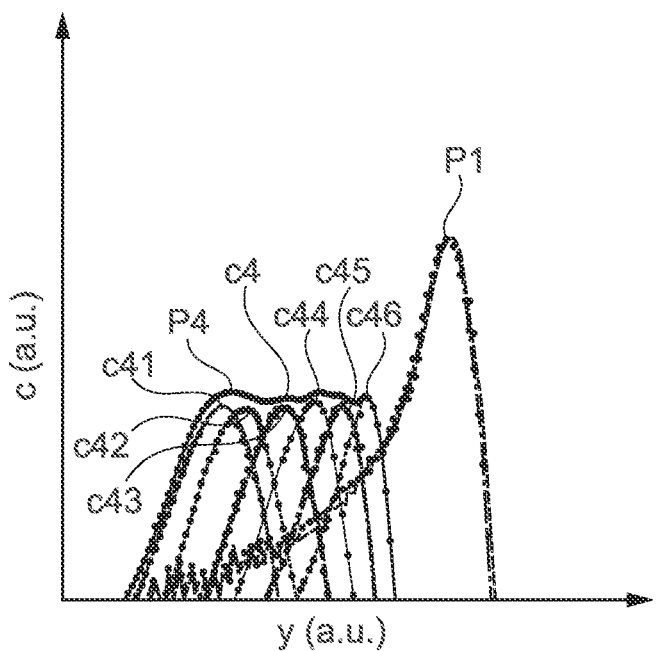

The schematic graphs of FIGS. 4 to 6 illustrate examples of hydrogen and helium concentration profiles along the vertical direction y in the field stop region 108 of the vertical power semiconductor device 100. For the sake of clarity, the third and fifth impurity peaks P3, P5 as illustrated in FIGS. 1 to 3 are omitted in FIGS. 4 to 6 although these peaks may also be present.

Referring to the schematic graph illustrated in FIG. 4, helium ions are implanted into the semiconductor body 102 by a plurality of different ion implantation tilt angles. A vertical profile of a helium concentration $c2$ is a superposition of profiles of single vertical helium concentrations $c21$, $c22$, $c23$, wherein the profiles of single vertical helium concentrations $c21$, $c22$, $c23$ are formed by helium ion implantations at constant energy but different ion implantation angles. The helium peak P2 is arranged between the hydrogen peak P1 and the first main surface.

Referring to the schematic graph illustrated in FIG. 5, in addition to helium ions implanted into the semiconductor body 102 as described with reference to FIG. 5, further helium ions are implanted into the semiconductor body 102 by even larger tilt angles than the ones associated with the helium peak P2 but equal ion implantation energy. As a result, a helium peak P4 is formed that is arranged between the hydrogen peak P1 and the second main surface. A vertical profile of a helium concentration $c4$ is a superposition of single profiles of vertical helium concentrations $c41$, $c42$, wherein the single profiles of vertical helium concentrations $c41$, $c42$ are formed by helium ion implantation at constant energy but different ion implantation angles.

Referring to the schematic graph illustrated in FIG. 6, helium ions are implanted into the semiconductor body 102 by a plurality of different ion implantation tilt angles. A vertical profile of a helium concentration $c4$ is a superposition of profiles of single vertical helium concentrations $c41$, $c42$, $c43$, $c44$, $c45$, $c46$, wherein the profiles of single vertical helium concentrations $c41$, $c42$, $c43$, $c44$, $c45$, $c46$ are formed by helium ion implantations at constant energy but different ion implantation angles. The helium peak P4 is arranged between the hydrogen peak P1 and the second main surface.

Figure 7:
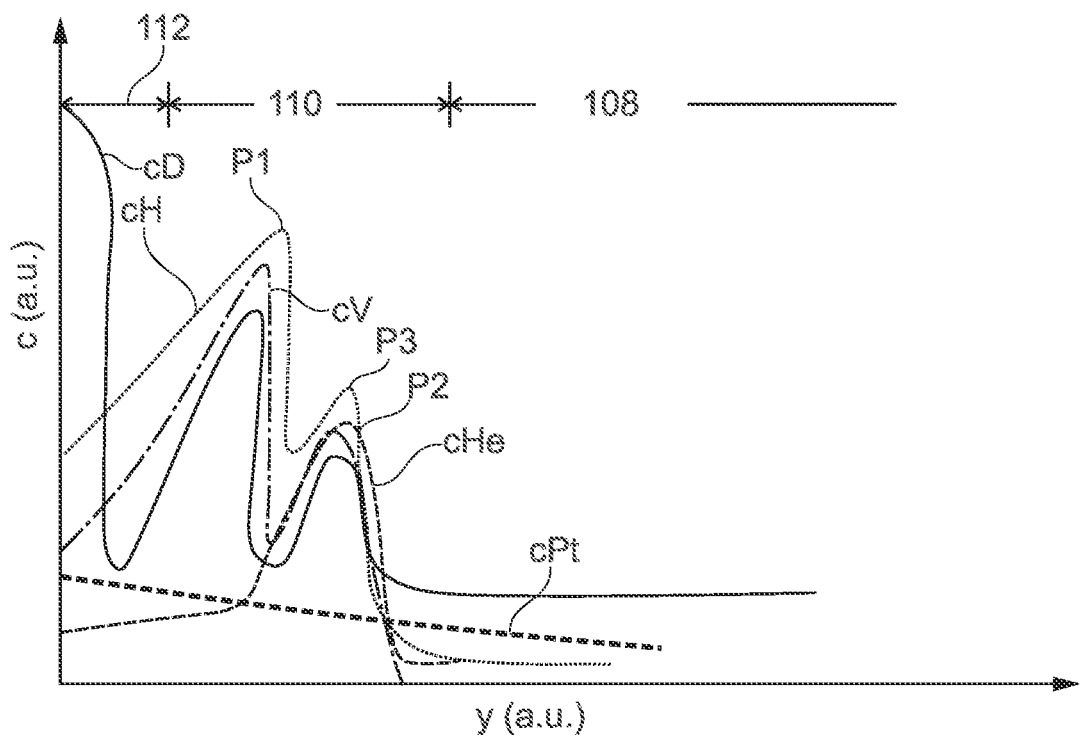
FIG. 7 is a schematic graph illustrating exemplary impurity concentrations c versus a vertical direction y of a vertical power semiconductor diode.

Referring to the schematic graph illustrated in FIG. 7, exemplary vertical profiles of concentrations c of impurities are illustrated along the vertical direction y from the second main surface, e.g. a cathode side of a diode, toward the first main surface, e.g. an anode side of a diode. The vertical profiles are divided into a cathode region 112, the field stop region 110 and the drift region 108.

A vertical profile of a helium concentration cHe is similar to the example illustrated in FIG. 1. A vertical profile of a hydrogen concentration cH has a main peak P1 in the field stop region 110 arranged between a peak P2 of the helium concentration cH and the first main surface.

A vertical profile of a vacancy concentration cV includes peaks at positions close to or equal to the first and second peaks P1, P2.

A vertical profile of n-type doping concentration cD includes peaks at positions close to or equal to the first and second peaks P1, P2, which are due to formation of hydrogen-related donors. The vertical profile of n-type doping concentration cD increases toward a maximum at or close to the second main surface in the collector or cathode region 112. The maximum may be configured as a cathode contact region, for example.

In the illustrated schematic example, a vertical profile of Pt concentration cPt decreases from the second main surface toward the drift region 108 and is larger in the drift region than the hydrogen concentration cH. Lowering of the hydrogen concentration cH in the drift region 108, and thus reduction of undesired platinum-hydrogen complexes in the drift region can be achieved by gettering of hydrogen around the helium peak P2.

Figure 8:
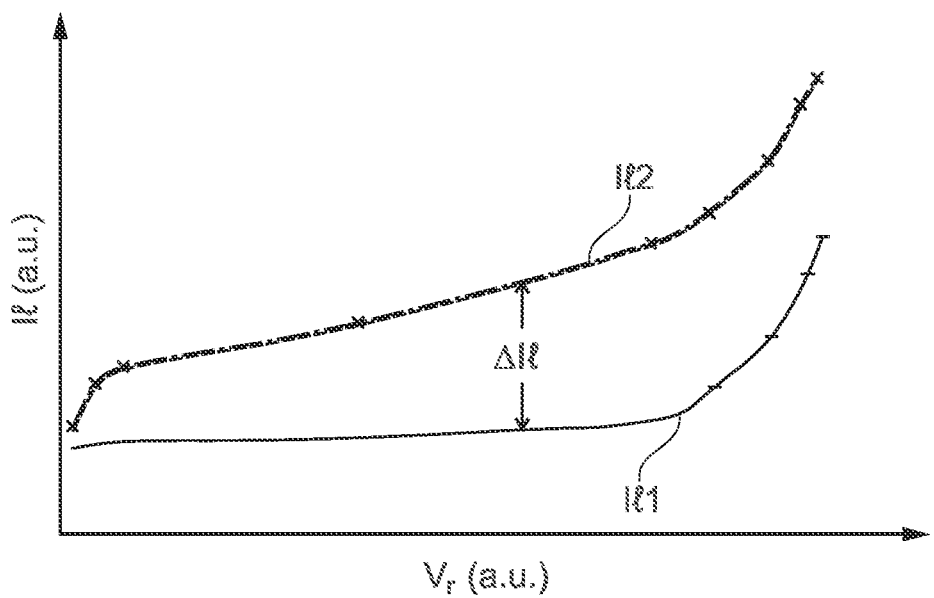
FIG. 8 is a schematic graph illustrating experimental leakage currents Il versus a reverse or blocking voltage Vr of vertical power semiconductor devices.

The above examples allow for a reduction of electric power dissipation in semiconductor devices by lowering leakage current in the drift region 108 of the semiconductor device. FIG. 8 is a schematic graph illustrating experimental results of an electric leakage current Il for reverse or blocking voltages Vr. A leakage current Il1 is associated with a semiconductor device sample as described in the examples above, i.e. a semiconductor device sample including a helium peak in the field stop region for gettering of hydrogen and reducing undesired platinum-hydrogen complexes in the drift region. A leakage current Il2 is associated with a semiconductor device sample lacking the provisions as described with reference to the sample of Il1. A difference in leakage current ΔIl allows for quantification of the reduction of the relation between the concentration of platinum/hydrogen complexes and substitutional platinum and thus of leakage current-induced electric power dissipation, for example.

The aspects and features mentioned and described together with one or more of the previously described examples and figures, may as well be combined with one or more of the other examples in order to replace a like feature of the other example or in order to additionally introduce the feature to the other example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A vertical power semiconductor device, comprising:
    a semiconductor body having a first main surface and a second main surface opposite to the first main surface along a vertical direction;
    a drift region in the semiconductor body, the drift region including platinum atoms;
    a field stop region in the semiconductor body between the drift region and the second main surface, the field stop region including a plurality of impurity peaks,
    wherein a first impurity peak of the plurality of impurity peaks has a larger concentration than a second impurity peak of the plurality of impurity peaks,
    wherein the first impurity peak includes hydrogen and the second impurity peak includes helium,
    wherein a third impurity peak of the plurality of impurity peaks is disposed at a third vertical distance from the second main surface that differs from 0 to 300 nm from a second vertical distance of the second impurity peak with respect to the second main surface, and wherein the third impurity peak includes hydrogen, and
    wherein a fourth impurity peak of the plurality of impurity peaks includes helium and is disposed at a fourth vertical distance from the second main surface, and wherein the third vertical distance ranges between the second vertical distance and the fourth vertical distance.

2. The vertical power semiconductor device of claim 1, wherein a first vertical distance between the first impurity peak and the second impurity peak ranges from 0 μm to 5 μm.

3. The vertical power semiconductor device of claim 1, wherein a concentration of the third impurity peak is larger than a concentration of the second impurity peak.

4. The vertical power semiconductor device of claim 1, wherein a vertical distance between the second impurity peak and the second main surface is larger than a vertical distance between the second main surface and the first impurity peak.

5. The vertical power semiconductor device of claim 1, wherein a vertical distance between the second impurity peak and the second main surface is smaller than a vertical distance between the second main surface and the first impurity peak.

6. The vertical power semiconductor device of claim 1, wherein a ratio between a peak concentration of the first impurity peak and a peak concentration of the second impurity peak ranges from 10 to 1000.

7. The vertical power semiconductor device of claim 1, wherein a helium peak concentration of the second impurity peak ranges from $1\times10^{16}$ cm$^{-3}$ to $2\times10^{18}$ cm$^{-3}$.

8. The vertical power semiconductor device of claim 1, wherein a maximum concentration of platinum in the drift region ranges from $5\times10^{12}$ cm$^{-3}$ to $3\times10^{14}$ cm$^{-3}$.

9. The vertical power semiconductor device of claim 1, wherein the drift region has a vertical extension from the field stop region to a pn-junction, and wherein a maximum concentration of hydrogen in the drift region is smaller than a concentration of platinum along at least 50% of the vertical extension of the drift region.

10. The vertical power semiconductor device of claim 1, wherein a maximum hydrogen concentration in the field stop region is at least a factor of 5 larger than a maximum hydrogen concentration in the drift region.

11. The vertical power semiconductor device of claim 1, wherein a fifth impurity peak of the plurality of impurity peaks includes hydrogen and is disposed at a fifth vertical distance from the second main surface, and wherein the fifth vertical distance is larger than the vertical distance between the first impurity peak and the second main surface.

12. The vertical power semiconductor device of claim 11, wherein the fourth impurity peak and the fifth impurity peak are located at the same vertical distance from the second main surface.

13. A vertical power semiconductor device, comprising:
    a semiconductor body having a first main surface and a second main surface opposite to the first main surface along a vertical direction;
    a drift region in the semiconductor body, the drift region including platinum atoms;
    a field stop region in the semiconductor body between the drift region and the second main surface, the field stop region including a plurality of impurity peaks,
    wherein a first impurity peak of the plurality of impurity peaks has a larger concentration than a second impurity peak of the plurality of impurity peaks,
    wherein the first impurity peak includes hydrogen and the second impurity peak includes helium,
    wherein the platinum atoms in the drift region are configured as platinum-hydrogen complexes and substitutional platinum, and
    wherein a maximum concentration of the platinum-hydrogen complexes in the drift region is smaller than a concentration of the substitutional platinum along at least 50% of the vertical extension of the drift region.

14. A vertical power semiconductor device, comprising:
a semiconductor body having a first main surface and a second main surface opposite to the first main surface along a vertical direction;
a drift region in the semiconductor body, the drift region including platinum atoms;
a field stop region in the semiconductor body between the drift region and the second main surface, the field stop region including a plurality of impurity peaks,
wherein a first impurity peak of the plurality of impurity peaks has a larger concentration than a second impurity peak of the plurality of impurity peaks,
wherein the first impurity peak includes hydrogen and the second impurity peak includes helium,
wherein a third impurity peak of the plurality of impurity peaks is disposed at a third vertical distance from the second main surface that differs from 0 to 300 nm from a second vertical distance of the second impurity peak with respect to the second main surface, and wherein the third impurity peak includes hydrogen,
wherein the second impurity peak and the third impurity peak are located at the same vertical distance from the second main surface.

* * * * *